(12) United States Patent
Goto et al.

(10) Patent No.: US 6,563,332 B2
(45) Date of Patent: *May 13, 2003

(54) CHECKER HEAD

(75) Inventors: Yoshihiro Goto, Ogaki (JP); Shinji Ohno, Ogaki (JP); Yasumitsu Murase, Ogaki (JP)

(73) Assignee: Ibiden Co., Ltd., Ogaki (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/463,995

(22) PCT Filed: Aug. 20, 1998

(86) PCT No.: PCT/JP98/03689
§ 371 (c)(1),
(2), (4) Date: May 9, 2000

(87) PCT Pub. No.: WO99/10748
PCT Pub. Date: Mar. 4, 1999

(65) Prior Publication Data
US 2002/0113611 A1 Aug. 22, 2002

(30) Foreign Application Priority Data
Aug. 21, 1997 (JP) ............................................. 9-225034
Aug. 21, 1997 (JP) ............................................. 9-225080

(51) Int. Cl.$^7$ ............................................. G01R 31/02
(52) U.S. Cl. ........................................ 324/761; 324/754
(58) Field of Search ............................. 324/754, 158.1, 324/72.5, 117 R, 761, 437, 445, 446, 690, 696, 715, 724, 757

(56) References Cited

U.S. PATENT DOCUMENTS

| | | | | |
|---|---|---|---|---|
| 3,798,370 A | * | 3/1974 | Hurst | ........................ 178/18.05 |
| 4,427,250 A | * | 1/1984 | Hines | |
| 4,774,462 A | * | 9/1988 | Black | |
| 4,814,697 A | * | 3/1989 | Kruger | |
| 4,862,077 A | * | 8/1989 | Horel | |
| 5,410,260 A | | 4/1995 | Kazama | |
| 5,493,230 A | * | 2/1996 | Swart | |

FOREIGN PATENT DOCUMENTS

| | | |
|---|---|---|
| JP | 137787/1983 | 4/1985 |
| JP | 1-276073 A | 11/1989 |

* cited by examiner

*Primary Examiner*—Kamand Cuneo
*Assistant Examiner*—Trung Nguyen
(74) *Attorney, Agent, or Firm*—Oblon, Spivak, McClelland, Maier & Neustadt, P.C.

(57) ABSTRACT

The present invention is a checker head for inspecting an object having even a small test pad pitch, without using a wired socket. The checker head includes a pin to be brought into contact with a test pad of the object, a conductor connected to a circuit tester, and a spring in contact with the pin and conductor and disposed linearly between the pin and conductor. Another mode of checker head has a structure in which a pin to be brought into contact with a test pad of an object and a conductor in contact with the pin and connected to a circuit tester are arranged in line and inserted through laminated body including an elastic layer, and the position of the pin and conductor are restricted by the elastic layer.

3 Claims, 3 Drawing Sheets

CHECKER HEAD

TECHNICAL FIELD

The present invention relates to a checker head with a pin to be brought into electrical contact with an inspected object such as a printed circuit in order to inspect the characteristics. More in detail, the present invention relates to a checker head used with connecting to a circuit tester in order to conduct electricity between a circuit tester such as the DC circuit tester and a test pad established in an inspected object.

BACKGROUND ART

An example of conventional checker head is shown in FIG. 5. The checker head 70 shown in FIG. 5 is made of the large number of set of a first contact pin 81, a second contact pin 82, a spring 83 and a wired socket 84 being disposed linearly and inserted through six laminated Bakelite board 71–76. Still, the first contact pin 81 has the nail shape, and its tip protrudes from the Bakelite board 71 of the front.

Of course, through holes for the first contact pin 81 and the like to pass through each Bakelite board 71–76 are established. And, the through hole of the Bakelite board 71 has a small diameter in comparison with the through hole of the Bakelite board 72, so the projection of the first contact pin 81 would be controlled by the contact of the ring division of the first contact pin 81 at this level difference.

The spring 83 is disposed in compressed condition, and pushes the second contact pin 82 toward an upward direction in FIG. 5 and pushes the wired socket 84 toward a downward direction in FIG. 5. This push pressure makes electrical connection between the wired socket 84 and the first contact pin 81. Especially, when the tip of the first contact pin 81 is pressed to a test pad 98 of a printed circuit 96 which is an inspected object, the spring 83 is further compressed. The push pressure increases as the compression of the spring 83 increases, and thus the electrical connection becomes more certain.

Still, the wired socket 84 has a structure in which a wire division 84b is tightened in a cylindric socket division 84a and connected to a circuit tester.

However, this conventional checker head 70 is not applicable to the recent printed circuit whose size has been reduced. Since the sizes of the recent printed circuits have been reduced, there have been demands that sizes and intervals of test pads 98 are smaller. In order to respond to theses demands, the pitch (it is shown by "p" in FIG. 5) of the first contact pin of the checker head must be decreased.

However, the limitation to reduce the pitch p was 0.6 mm in the checker head 70 shown in FIG. 5, since the wired socket 84 is used. The wired socket 84 has the above-mentioned structure in which a wire 84b is tightened in the cylindric socket 84a. In order to reduce the pitch p, it is necessary to decrease the diameter of the socket. But, it becomes more difficult to introduce and fix the wire 84b in the cylindric socket 84a as the socket diameter decreases. After all, the socket with a large diameter has been used because it is easy to introduce and fix the wire 84b in the cylindric socket 84a.

One means for solving the problems has been disclosed by Unexamined Japanese Patent Application Publication No. Hei. 6-148236 (corresponding to U.S. Pat. No. 5,410,260). In this publication, an invention in which elimination of a wired socket may reduce the pitch of pins has been disclosed. The composition of the invention is a checker head comprising a middle insulator having a support hole that supports a large diameter division of a pin in the shaft line direction and receives a coiled spring, and being united in a

DISCLOSURE OF THE INVENTION

To solve the problems, the first invention is a checker head comprising a pin to be brought into contact with a test pad of an inspected object, a leading wire being connected to a circuit tester, a spring being linearly provided between the pin and leading wire to contact both of the pin and leading wire, and a laminated body through which the pin, leading wire, and spring pass. And, the composition that the spring is always compressed can be added in this checker head.

This first invention's specific example will be able to express as following. In a checker head comprising a front board having a hole, an electroconductive pin in which the tip division protrudes from the hole of the front board and is in contact with an inspected object, a checker head comprising a large diameter division which is disposed at the position in the rear from the front board and in contact with the marginal of the hole of the front board from the back surface side, a rear board which locates in the rear from the large diameter division and through which a leading wire passes, an electroconductive spring which is located between the large diameter division and the rear board, and the pin and the leading wire being electrically conducted through the spring in at least the condition that the pin is pushed to the rear board.

In this checker head, the large diameter division of the pin is located between the front board and the rear board. Moreover, the preceding end of the large diameter division is in contact with the marginal of the hole of the front board from the back surface side. Therefore, it is prevented that the pin is pulled out to front side of the front board. And, the spring is disposed between the large diameter division of the pin and the rear board, so the pin is pushed back by the elastic force when the pin is in contact with an inspected object and is pushed in. By this, the tip division of the pin and the inspected object surely contact and electrically conduct. And, the pin and the leading wire also contact through a spring each other and are electrically connected. In this case, the spring and the leading wire may be integratedly molded or may be united by joining different member together by welding or soldering, etc.

In addition, the specific example of the first invention can be added the structures in which a middle board is established between the front board and the rear board and has a large hole in comparison with the diameter of the large diameter division and the spring, and the large diameter division and the spring are located in the hole of the middle board. In this checker head, the spring and the large diameter division of the pin are together located in the hole of the middle board, so the hole positions the direction of the spring and the large diameter division in the plate surface of the front board and the like and their actuations are sure.

To solve the problems, the second invention is a checker head comprising a pin to be brought into contact with a test pad of an inspected object, a middle pin being in contact with the pin, a leading wire being in contact with the middle pin and being connected to a circuit tester, and the pin, middle pin, and leading wire being linearly disposed and passing through a laminated body including an elastic layer, and the elastic layer restricting their positions.

In addition, to solve the problems, the third invention is a checker head comprising a pin to be brought into contact with a test pad of an inspected object, a leading wire being in contact with the pin and connected to a circuit tester, and the pin and leading wire being linearly disposed and passing through a laminated body including an elastic layer, the elastic layer restricting their positions.

These second and the third invention's specific example can be expressed as in a checker head comprising a front board having a hole, an electroconductive pin of which a tip division protrudes from the hole of the front board and is in contact with an inspected object, a checker head comprising a large diameter division being disposed in the rear position from the front board in the pin and being in contact with the marginal of the hole of the front board from the back surface side, and an elastic layer retaining the pin with adherence to the position in the rear from front edge of the large diameter division of the pin.

In this checker head, when the pin is in contact with an inspected object and is pushed in, the pin will be pushed back by the repulsion of the elastic layer which retains the pin with the adherence to the position in the rear from front edge of the large diameter division of the pin. By this, the tip division of the pin and the inspected object surely contact each other and electrically conduct. Thereupon, the tip division and the large diameter division of the pin may be integratedly mold or may be united by joining different member together by welding or soldering, etc. And, the position of the pin being adhered to and retained by the elastic layer is a part (except for the front edge) of the large diameter division or more rear part of the large diameter division.

Especially, the specific example of the second invention can be expressed as in a checker head comprising a front board having a hole, a pin of which a tip division protrudes from the hole of the front board and is contact with an inspected object, a checker head comprising a large diameter division being disposed in the rear position from the front board in the pin and being in contact with the marginal of the hole of the front board from the back surface side, a middle pin being disposed rear of the large diameter division, and an elastic layer retaining the middle pin with adherence to the middle pin.

In this checker head, the elastic layer adheres and retains the middle pin of the different body to the pin. Even if the pin and the middle pin are different bodies, when the pin is contact with the inspected object and is pushed in, the pin is pushed back by the repulsion of an elastic layer. Therefore, the tip division of the pin and the inspected object, and the pin and the middle pin surely contact each other and are electrically connected.

In addition, the specific example of the second or third invention can add the structure in which a middle board is established between the front board and the elastic layer and has a large hole in comparison with the diameter of the large diameter division, and the large diameter division is located in the hole of the middle board.

In this checker head, the middle board is established between the front board and the elastic layer, and they are laminated and made into a one-body. And, the hole of the middle board positions the large diameter division in the in-plane direction.

BEST MODES OF CARRYING OUT THE INVENTION

[The First Invention's Embodiment]

Figure 1:
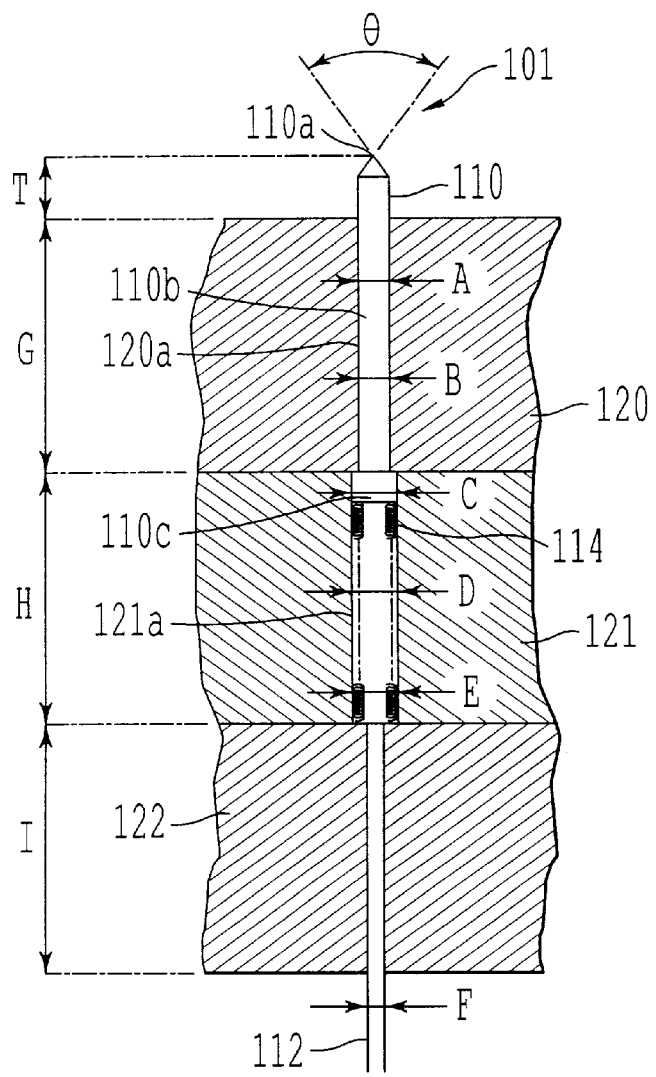
FIG. 1 is an explanatory drawing for the composition of a checker head according to the first invention's embodiment.

Hereinafter, a checker head according to the first invention's embodiment is explained in detail with reference to the drawings. The essential part of a checker head 101 according to this embodiment, is shown in FIG. 1. A checker head 101 has a structure in which a pin 110, a spring, and a leading wire are arranged in line and pass through a laminated body of a three-layer structure made of a front board 120, a middle board 121, and a rear board 122.

Figure 2:
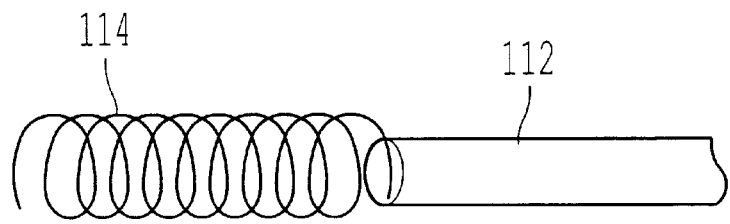
FIG. 2 is an explanatory drawing showing a spring and a leading wire in FIG. 1.

A pin 110 is a member of nail shape, which consists of a conic tip division 110a, a body division 110b, and a large diameter division 110c, and is made from tool steel such as the SK material. Angle θ of the tip division 110a is about 60°, and a large diameter division 110c of a little big diameter in the opposite side of the tip division 110a is established. Diameter B of the body division 110b (a part except for the tip division 110a and the large diameter division 110c) is 0.22 mm, and diameter C of the large diameter division 110c is 0.26 mm. A spring 114 with electro conductivity has the outer diameter E of 0.25 mm, and is located and contacts with the rear (downward in FIG. 1) of the large diameter division 110c of the pin 110. A leading wire 112 is located and is contact with the spring 114 more and more rear, and the diameter F is 0.11 mm. The spring 114 and the leading wire 112 are formed into a one-body by soldering or welding, as it is shown in FIG. 2.

Each of a front board 120, a middle board 121 and a rear board 122 is a plane member made from the material having insulation and moderate rigidity such as the engineering plastic, and has a hole (drilled hole) in which a pin 110, etc. is put. The front board 120 has a thickness G of 2 mm, and diameter A of a hole 120a is 0.25 mm. The middle board 121 has a thickness H of 2 mm, and diameter D of a hole 121a is 0.28 mm. The rear board 122 has a thickness I of 2 mm, and a hole through a leading wire 112 is opened.

The large diameter division 110c of the pin 110 is located in the hole 121a of the middle board 121. The part except for the large diameter division 110c passes through the hole 120a of the front board 120, and the part of about 0.5 mm including tip division 110a protrudes from the laminated body. The pin 110 cannot move forward from the position where the front side of the large diameter division 110c contacts the back surface of the front board 120, because the diameter C of the large diameter division 110c is bigger than the diameter A of the hole of the front board 120.

The spring 114 is located in the hole 121a of the middle board 121, and is compressed a little by the large diameter division 110c of the pin 110 and the rear board 122. The leading wire 112 is inserted through the rear board 122, and the side, which is not joining with the spring 114, comes out from the laminated body. In this condition, the pin 110 is in contact with the spring 114, and it electrically connects the pin 110 and the leading wire 112.

Still, in FIG. 1, only one-set pin 110 is shown, but actually, the large sets are parallelly installed for the front board 120 and the like. If each part material of written dimension is used, it is possible to provide the pins 110 and the like with 0.4 mm pitch.

Figure 5:
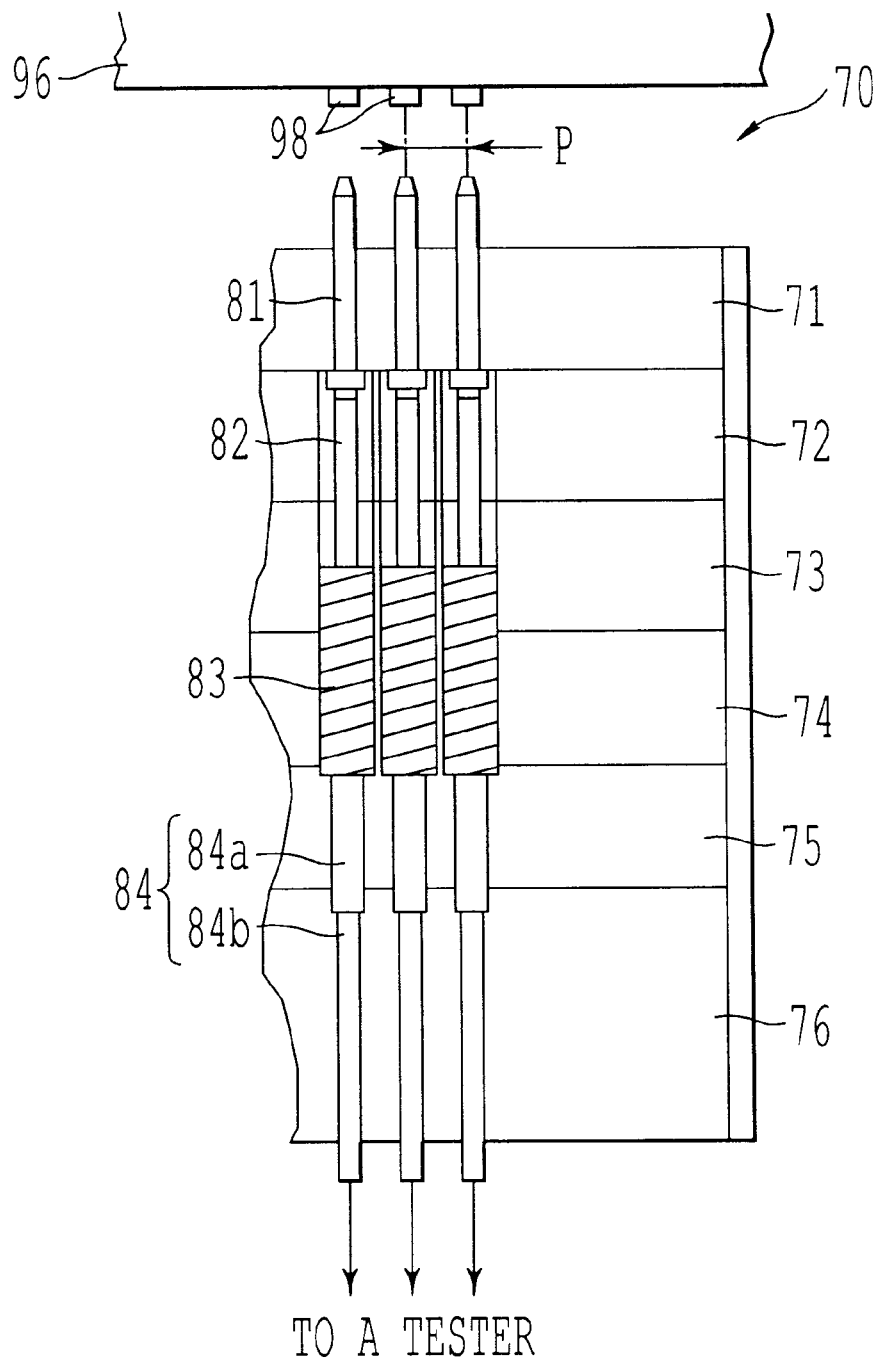
FIG. 5 is an explanatory drawing for the composition of conventional checker head.

This checker head 111 is used in the condition that the leading wire 112 is connected to a circuit tester such as a DC circuit tester. In the condition, when the tip division 110a of the pin 110 is pressed to the test pad 98 of the printed circuit 96 (see FIG. 5 with respect to the printed circuit 96 and the test pad 98), the circuit tester and the test pad 98 are electrically connected through the pin 110, the spring 114, and the leading wire 112, and characteristic inspection of the printed circuit 96 by the circuit tester is ready. This time, since the pin 110 is pushed downwardly in FIG. 1 by the test pad 98, the spring 114 is further compressed. Therefore, the pin 110 is pushed back by the elastic force of the spring 114, and by this repulsion, the pin 110 and the test pad 98 surely contact each other and the spring 114 and the pin 10 surely contact each other, and the good electrical connection is ensured between them.

As the above explained in detail, in the checker head 101 of this execution, the spring 114 is disposed in a little compressed condition between the pin 110 and the rear board 122. By this, when the pin 110 is pressed to the test pad 98 of the printed circuit 96, the electrical conduction from the leading wire 112 to the test pad 98 becomes surely by the elastic force of the spring 114. Thereupon, a pitch between pins may be reduced, since a wired socket is not used unlike conventional checker head.

In addition, this checker head is easily constructed, since the number of sheets of the plate like the front board 120 and the middle board 121 is small.

Still, aforesaid embodiment is mere exemplification, and the present invention is not limited at all. Therefore, various improvements and modifications can be made hereto within the scope without departing from the concept of the invention. For example, in aforesaid embodiment, although the pin 110 and the spring 114 are merely in contact, but not joined together, they may be joined together by soldering, etc. And, in aforesaid embodiment, the spring 114 is joined and is united together with the leading wire 112, but it may be done so that both may not come off by tightening the leading wire 112 of a little large diameter in comparison with the inside diameter of the spring 114, etc. And, the front board 120 and the middle board 121 may be composed of the plate of one sheet.

In addition, although the dimension of each position is explained above when the pitch is supposed 0.4 mm, the pitch may be smaller. For example, the pitch may be 0.25 mm at the minimum, if each dimension is chosen as follows: the diameter A of the hole 120a of the front board 120 is 0.15 mm; the plate thickness G is 1.5 mm; the diameter B of the body division 10b of the pin 110 is 0.13 mm; the diameter C of the large diameter division 110c is 0.18 mm; the diameter D of the hole 121a of the middle board 121 is 0.20 mm; the plate thickness H is 2 mm; and the outer diameter E of the spring 114 is 0.18 mm. Here, on the front board 120, the following are reduced: Not only the diameter A of the hole but also the plate thickness G. The reason is that the location accuracy of the hole cannot be guaranteed, when the hole is formed by drilling and the value of the quotient which is calculated by dividing the plate thickness G by the hole diameter exceeds 10.

[The Second Invention's Embodiment]

Figure 3:
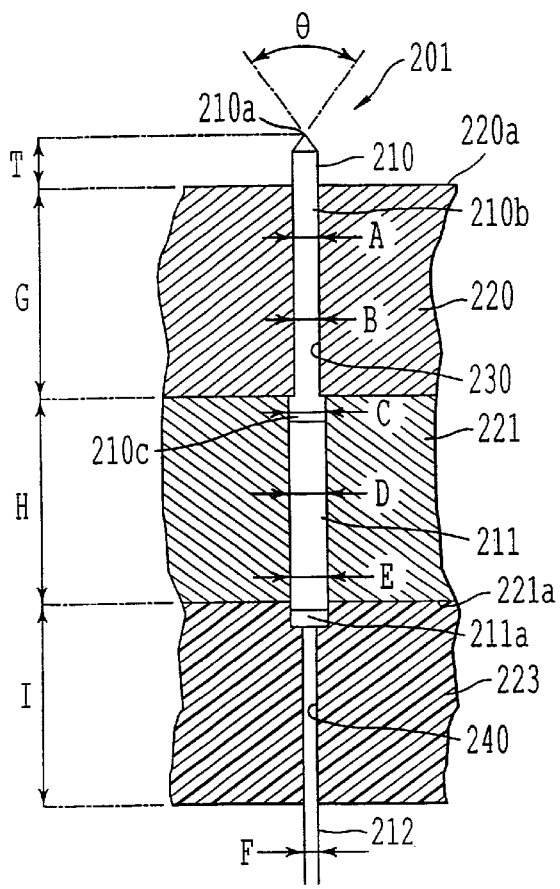
FIG. 3 is an explanatory drawing for the composition of a checker head according to the second invention's embodiment.

Hereinafter, a checker head according to the second invention's embodiment is specifically described with reference to the drawings. Still, the description is omitted on the structure similar to above-mentioned first embodiment. The essential part of the checker head 201 according to this embodiment is shown in FIG. 3. The checker head 201 has a structure in which a pin 210, a middle pin 211, and a leading wire 212 are disposed linearly and inserted through a laminated body of three layers made of a front board 220, a middle board 221, and an elastic layer 223. The boards including the front and middle boards (220 and 221) has a forward side (220a) and a rear side (22 1a). A hole 230 extends through the front and middle boards (220 and 221) from the forward side (220a) to the rear side (22 1a). A through hole 240 is formed in the elastic insulation layer 223 to be aligned with the hole 230.

The pin 210 is similar to the pin 110 in above-mentioned first embodiment. The pin 210 includes a tip division (210a) which is configured to contact a test pad. The middle pin 211 includes a rear division (211 a) which is connected to the tip tip division (210a) of the pin 210. The middle pin is a rod of 0.25 mm diameter E, and is located in and in contact with the rear (downward in FIG. 3) of the large diameter division 10c of the pin 210. The leading wire 212 is a conductor, which is located further backward with respect to and in contact with the rear division (211a) of the middle pin 11 and has a diameter F of 0.18 mm. The leading wire 212 and the middle pin 211 are formed into a one-body by soldering or welding. An insulation covering wire covered by a resin or the like may be used as the leading wire 212.

The front board 220 and the middle board 221 are similar to the front board 120 and the middle board 121 in above-mentioned first embodiment. The elastic layer 223 is an elastic organ of insulation such as silicon resin, and formed by being applied and cured in the circumference (in the case of a insulation covering wire, the circumference of the insulation cover) of the leading wire 212, etc. on the rear face of the middle board 121 and the thickness I is 2 mm.

The relationship between the front board 220 and the middle board 221 for the pin 210 is similar to the relationship between the front board 120 and the middle board 121 for the pin 110 in above-mentioned first embodiment.

Although the most part of the middle pin 211 is located in the hole of the middle board 221, the rear end part of the middle pin 211 extends to the elastic layer 223. The elastic layer 223 adheres to this rear end part of the middle pin 211 and the leading wire 212, and in this condition, the pin 210 is in contact with the middle pin 211 and electrically connected to the leading wire 212.

This checker head 201 is used in a condition that the leading wire 212 is connected to a circuit tester such as the DC circuit tester. In that condition, when the tip division 210a of the pin 210 is pressed to the test pad 98 of the printed circuit 96 (see FIG. 5 with respect to the printed circuit 96 and the test pad 98), the circuit tester and the test pad 98 are electrically connected through the pin 210, the middle pin 211, and the leading wire 212, and the characteristic inspection of the printed circuit 96 by the circuit tester is ready. At this time, the test pad 98 pushes the pin 210 downwardly in FIG. 3, and in addition, the pin 210 pushes the middle pin 211 downwardly. But, as it is aforesaid, the middle pin 211 is pushed back by the repulsion of the elastic layer 223. And, by this repulsion, the middle pin 211, the pin 210, and pin 210 surely contact each other and ensure the good electrical connection.

As explained above, in the checker head 201 according to this embodiment, a middle pin 211 is disposed at the rear of a pin 210 and an elastic layer 223 that adheres to and retains the rear of the middle pin 221 is formed. Therefore, in this checker head 201, when the pin 210 is pressed to a test pad 98 of a printed circuit 96, the electrical connection between the middle pin 211 and the test pad 98 becomes certain by the repulsion of the elastic layer 223. Thereupon, this checker head 201, unlike conventional checker head, may decrease a pitch between pins, since a wired socket is not used. And, the assembly is easy and it is also useful for the reduction of the parts count, since the number of sheet of the plate like a front board 220 and a middle board 221 is small. And, the life of a spring does not become a problem for this checker head 201, since a spring like conventional checker head is not used.

Aforesaid embodiment is mere exemplification, so the invention is not limited to it. Therefore, various improvement and modifications can be made thereto within the scope nots departing from the concept of the invention. For example, in aforesaid embodiment, the pin 210 and the middle pin 211 are merely in contact, but not joined together. However, they may be joined together by soldering, etc. And, the front board 220 and the middle board 221 may be composed of the plate of one sheet.

In addition, although the dimension of each position has been explained above when the pitch is supposed to be 0.4 mm, the pitch may be smaller. For example, the pitch may be 0.25 mm, if the diameter A of the hole 220*a* of the front board 220 is 0.15 mm; the plate thickness G is 1.5 mm; the diameter B of the body division 210*b* of the pin 210 is 0.13 mm; the diameter C of the large diameter division 210*c* is 0.18 mm; the diameter D of the hole of the middle board 221 is 0.20 mm; the plate thickness H is 2 mm; the diameter E of the middle pin 211 is 0.18 mm; and the diameter F of the leading wire is 0.15 mm.

[The Third Invention's Embodiment]

Figure 4:
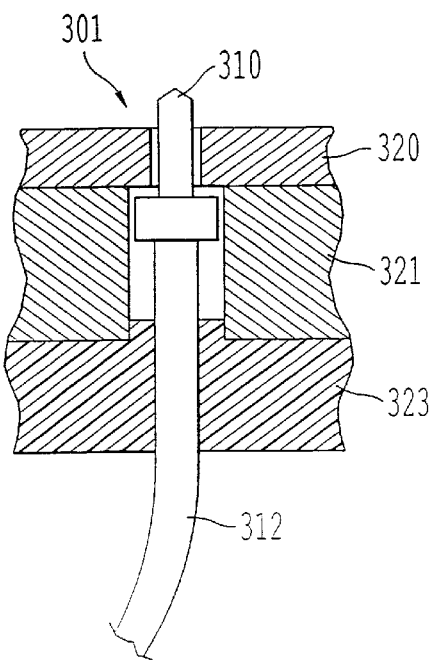
FIG. 4 is an explanatory drawing for the composition of a checker head according to the third invention's embodiment.

In an embodiment of aforesaid second invention, three members of a pin 210, a middle pin 211, and a leading wire 212 constitute a set of a pin, but other structures are also possible. For example, in FIG. 4, a leading wire 312 is directly connected to a pin 310, and an elastic layer 323 adheres to and retains this leading wire 313. Similarly, in this structure, when the pin 310 is pressed to a test pad 98 of a printed circuit 96, the electrical connection between the test pad 98 and the leading wire 312 is certain by the repulsion of the elastic layer 323. In this case, the pin 310 and the leading wire 312 may be joined together by contacting only or by soldering, etc. And, an elastic layer 323 may adhere to and retain a large diameter division of a pin 310 instead of a leading wire 313.

INDUSTRIAL APPLICABILITY

As explained above, the present invention can decrease a pitch between pins, since a wired socket is not used. Therefore, the present invention can provide a checker head, which is also applicable to an inspected object with small test pad pitch.

What is claimed is:

1. A checker head comprising:
   a pin including
      a tip division configured to contact a test pad provided on an inspected object, and
      a rear division connected to the tip division;
   a leading wire electrically connected to the rear division of the pin; and
   a laminated body comprising
      a board made from an insulation material with rigidity, the board including
         a forward side,
         a rear side,
         a hole extending through the board from the forward side to the rear side, the pin being movably inserted into the hole, the tip division of the pin projecting from the forward side, the rear division of the pin projecting from the rear side, and
      an elastic insulation layer provided on the rear side of the board and having a through hole aligned with the hole, the rear division of the pin and the leading wire being inserted into the through hole, the elastic insulation layer being configured to be elastically deformed to apply force to the pin in a forward direction to press the tip division to the test pad when force is applied to the pin in a backward direction to retract the tip division.

2. A checker head according to claim 1, wherein the pin includes a large diameter division which connects the tip division and the rear division, the hole includes a large diameter hole which the large diameter division of the pin is movably inserted into.

3. A checker head according to claim 2, wherein the rear division of the pin is a part separate from the tip division and the large diameter division.

\* \* \* \* \*